(12) United States Patent
Joshi et al.

(10) Patent No.: US 7,681,628 B2
(45) Date of Patent: Mar. 23, 2010

(54) DYNAMIC CONTROL OF BACK GATE BIAS IN A FINFET SRAM CELL

(75) Inventors: Rajiv V. Joshi, Yorktown Heights, NY (US); Keunwoo Kim, Somers, NY (US); Edward J. Nowak, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 11/402,400

(22) Filed: Apr. 12, 2006

(65) Prior Publication Data
US 2007/0242497 A1 Oct. 18, 2007

(51) Int. Cl.
*G11C 11/00* (2006.01)
(52) U.S. Cl. ...................................... 165/154
(58) Field of Classification Search ................ 365/154
See application file for complete search history.

(56) References Cited
U.S. PATENT DOCUMENTS
5,726,562 A * 3/1998 Mizuno ..................... 323/312

| | | | |
|---|---|---|---|
| 2001/0028575 A1* | 10/2001 | Ang et al. | 365/154 |
| 2003/0214833 A1* | 11/2003 | Hsu et al. | 365/154 |
| 2004/0032761 A1* | 2/2004 | Wong | 365/154 |
| 2004/0252548 A1* | 12/2004 | Tsukamoto et al. | 365/154 |
| 2005/0051867 A1* | 3/2005 | Lee et al. | 257/510 |
| 2005/0130358 A1* | 6/2005 | Chidambarrao et al. | 438/197 |
| 2005/0237840 A1* | 10/2005 | Diorio et al. | 365/225.7 |
| 2006/0262628 A1* | 11/2006 | Nii et al. | 365/226 |

* cited by examiner

*Primary Examiner*—Hoai V Ho
*Assistant Examiner*—Anthan T Tran
(74) *Attorney, Agent, or Firm*—Brian Verminski; Joffman Warnick LLC

(57) ABSTRACT

The present invention provides dynamic control of back gate bias on pull-up pFETs in a FinFET SRAM cell. A method according to the present invention includes providing a bias voltage to a back gate of at least one transistor in the SRAM cell, and dynamically controlling the bias voltage based on an operational mode (e.g., Read, Half-Select, Write, Standby) of the SRAM cell.

13 Claims, 11 Drawing Sheets

DYNAMIC CONTROL OF BACK GATE BIAS IN A FINFET SRAM CELL

FIELD OF THE INVENTION

The present invention relates to semiconductor devices, and more specifically to dynamic control of back gate bias on pull-up pFETs in a FinFET SRAM cell.

BACKGROUND OF THE INVENTION

Dopant fluctuations pose a serious problem in threshold voltage (Vt) control in advanced semiconductor devices, such as static random access memory (SRAM). As semiconductor devices become smaller and smaller, Vt control becomes more difficult. A known solution is to use back gates, such as found in FinFETs and other double gate transistors, to control Vt in the semiconductor devices. One serious problem with this solution is that the use of back gates in semiconductor devices has resulted in increased layout complexity, increased wiring densities, and therefore, higher cost. Further, known back gate biasing schemes have not been able to provide sufficient stability, performance, and reduction in leakage voltages, especially for SRAM.

SUMMARY OF THE INVENTION

The present invention addresses the above-mentioned problems, as well as others, by providing dynamic control of back gate bias on pull-up pFETs in a FinFET SRAM cell.

In a first aspect, the invention provides a method for controlling back gate bias in a static random access memory (SRAM) cell, comprising: providing a bias voltage to a back gate of at least one transistor in the SRAM cell; and dynamically controlling the bias voltage based on an operational mode of the SRAM cell.

In a second aspect, the invention provides a system for controlling back gate bias in a static random access memory (SRAM) cell, comprising: a bias voltage generator coupled to a back gate of at least one transistor in the SRAM cell for dynamically controlling the bias voltage applied to the at least one transistor based on an operational mode of the SRAM cell.

In a third aspect, the invention provides an integrated circuit comprising: a static random access memory (SRAM) cell; and a system for controlling back gate bias in the SRAM cell, the system for controlling including a bias voltage generator coupled to a back gate of at least one transistor in the SRAM cell for dynamically controlling the bias voltage applied to the at least one transistor based on an operational mode of the SRAM cell.

In a fourth aspect, the invention provides a static random access memory (SRAM) cell, comprising: at least one transistor having a back gate; and a bias voltage generator coupled to the back gate of the at least one transistor for dynamically controlling the bias voltage applied to the at least one transistor based on an operational mode of the SRAM cell.

In each of the above aspects, the invention may be implemented in an integrated circuit that includes other functions and circuitry not specifically described herein.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION OF THE INVENTION

Figure 1:
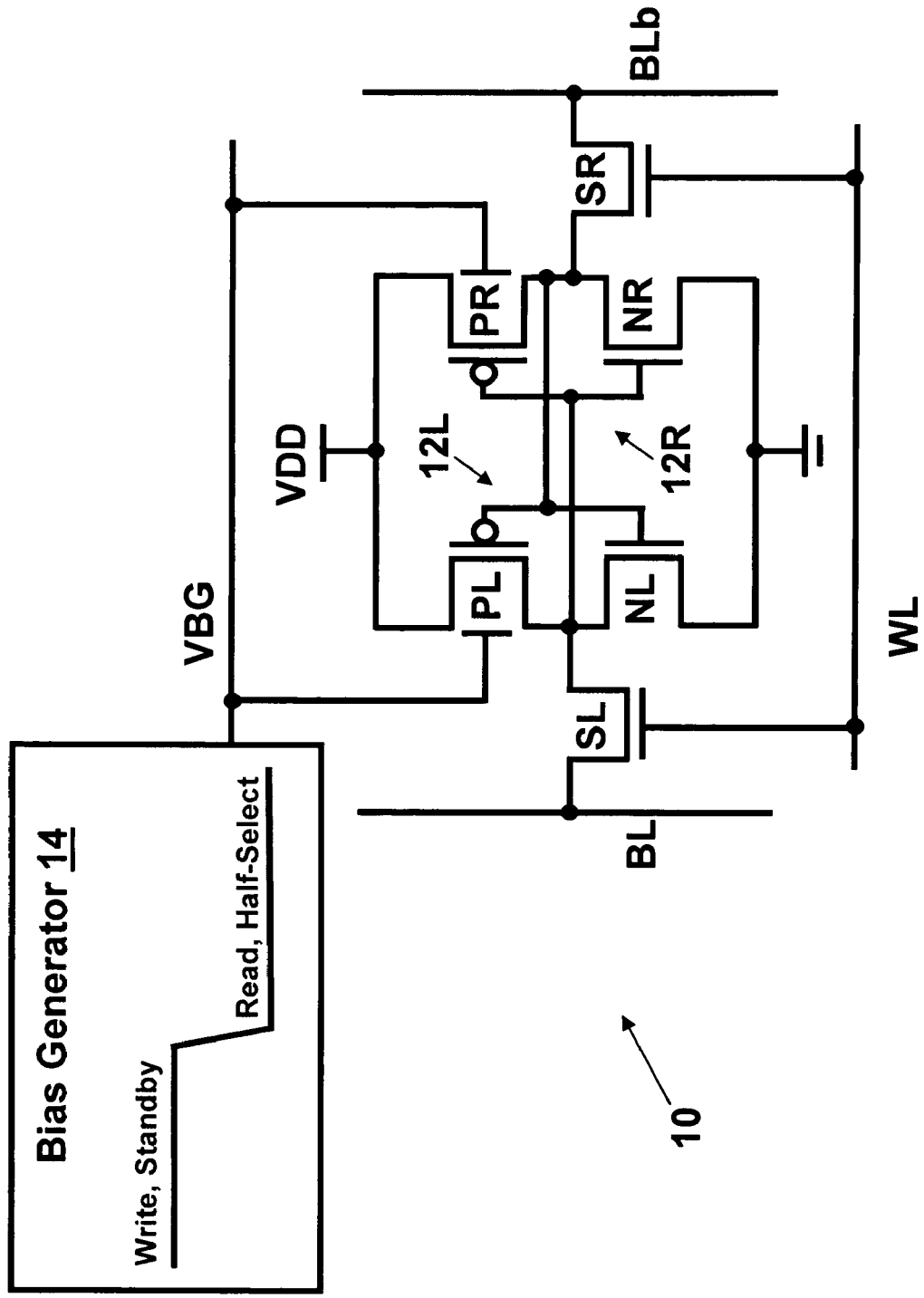
FIG. 1 depicts a six transistor (6-T) FinFET SRAM cell including dynamic control of back gate bias in accordance with an embodiment of the present invention.

A 6-T FinFET SRAM cell 10 including dynamic control of back gate bias in accordance with an embodiment of the present invention is depicted in FIG. 1. The SRAM cell 10 includes a pair of cross-coupled inverters 12L, 12R, and a pair of pass nFETs SL and SR connected to bit lines BL and BLb, respectively. The inverter 12L is formed by a pull-down FET NL and a pull-up pFET PL, and the inverter 12R is formed by a pull-down nFET NR and a pull-up pFET PR. A gate of each pass nFET SL and SR is connected to a word line WL.

Figure 2:
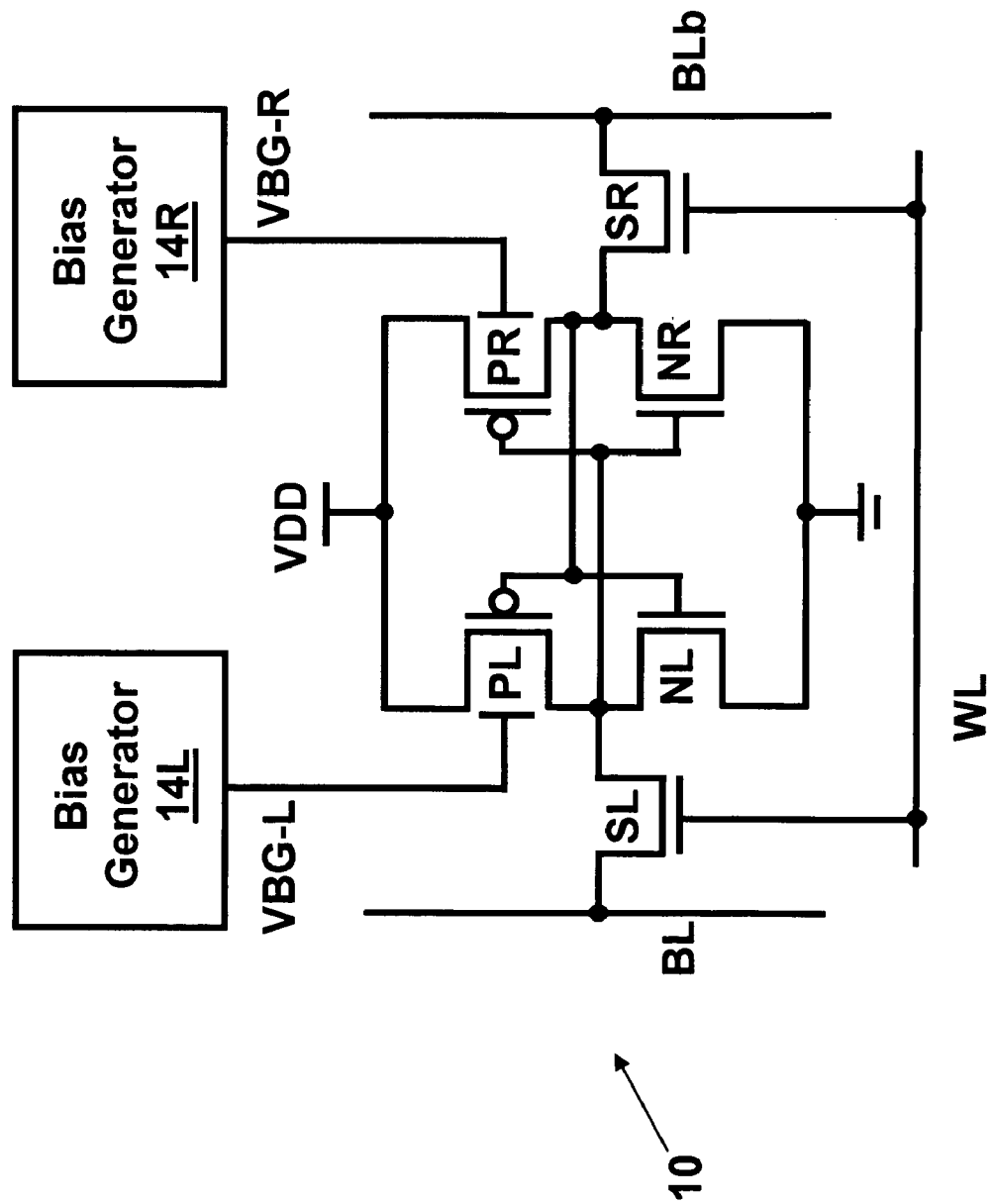
FIG. 2 depicts a 6-T FinFET SRAM cell including dynamic control of back gate bias in accordance with another embodiment of the present invention.

The SRAM cell 10 further includes a bias generator 14 for dynamically controlling the bias voltage VBG applied to the back gates of the pFETs PL and PR, based on the operational mode of the SRAM cell 10 (i.e., Read, Half-Select, Write, Standby). The pFETs PL and PR are formed with asymmetrical gates, wherein the gates are formed using different types of polysilicon (n+ or p+) or different gate work functions. Further, the pFETs PL and PR have an independently controlled (or biased) source, drain, front-gate, and back-gate. For clarity, the biasing for each of the back gates of the nFETs NL and NR and the pass nFETs SL and SR is not shown. The bias voltage VBG regulates the Vt and strength of the pFETs PL and PR to optimize the stability and performance of the SRAM cell 10 and to reduce leakage currents. As depicted within the box representing the bias generator 14, and as will be described in greater detail below, the bias voltage VBG is "0" (e.g., ground) for the Read and Half-Select operational modes of the SRAM cell 10, and is "1" (e.g., VDD) for the Write and Standby operational modes of the SRAM cell 10. In an alternative embodiment of the present invention (FIG. 2), separate bias voltages VBG-L and VBG-R can be applied to the back gates of the pFETs PL and PR, respectively, of the SRAM cell 10 using bias generators 14L and 14R, respectively. The bias voltages VBG-L and VBG-R can be independently and/or systematically controlled to optimize the SRAM cell 10.

The operation of the SRAM cell 10 will be described below for each of the following operational modes: Read; Half-Select; Write; and Stand-by.

Figure 3:
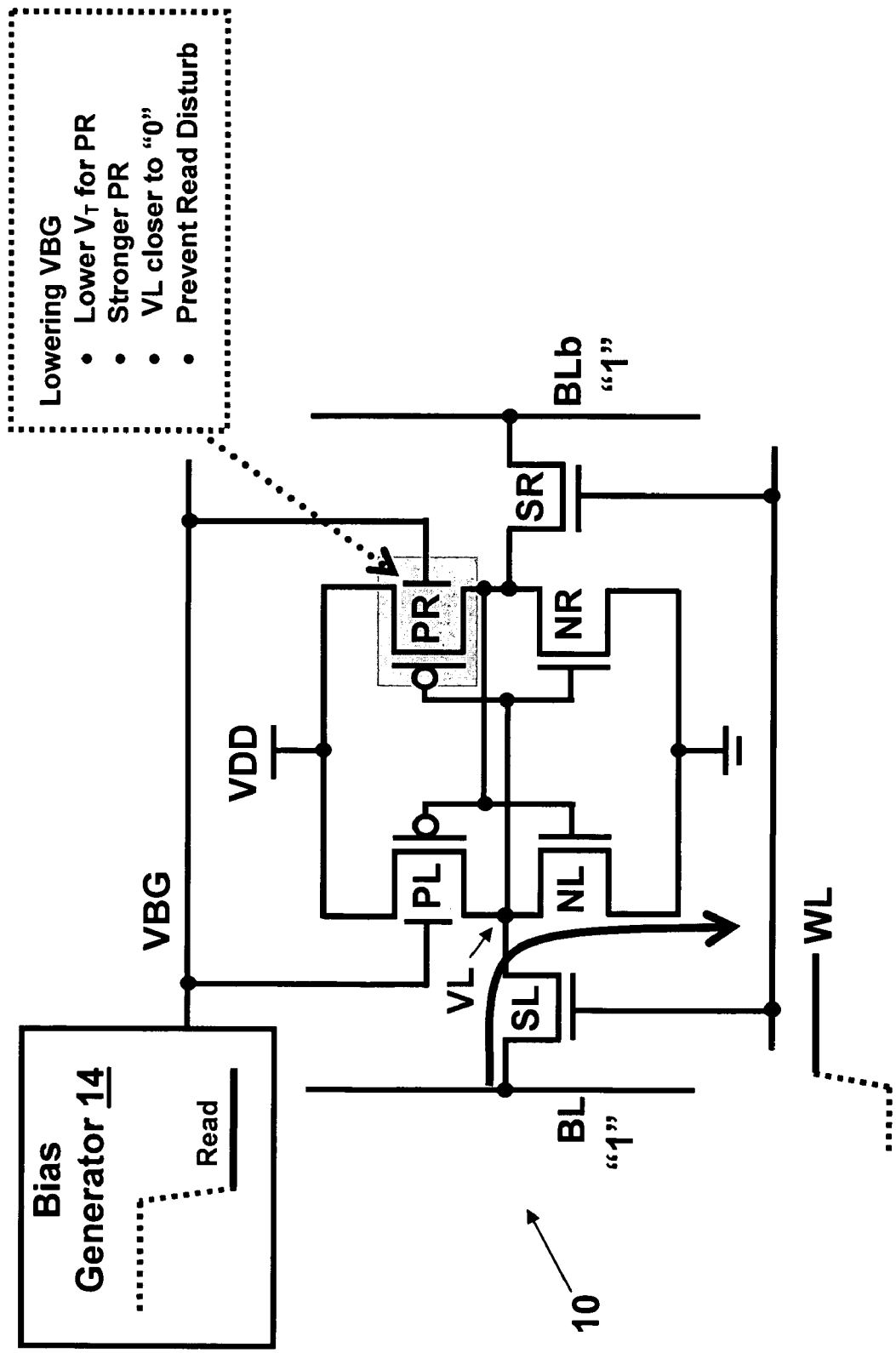
FIG. 3 depicts the SRAM cell of FIG. 1 during a Read operational mode in accordance with an embodiment of the present invention.

As depicted in FIG. 3, during the Read operational mode of the SRAM cell 10, the bit lines BL and BLb are precharged to "1," the word line WL is asserted, and the bias voltage VBG applied to the back gates of the pFETs PL and PR by the bias generator 14 is lowered to "0." As a result, the Vt of the pFET PR is lowered, increasing its strength. When a "0" is stored at VL, the strengthening of the pFET PR causes VL to move closer to "0," ensuring that the nFET NR remains turned off. This prevents a Read disturb, which can occur if VL is high enough to turn on the nFET NR.

Figure 4:
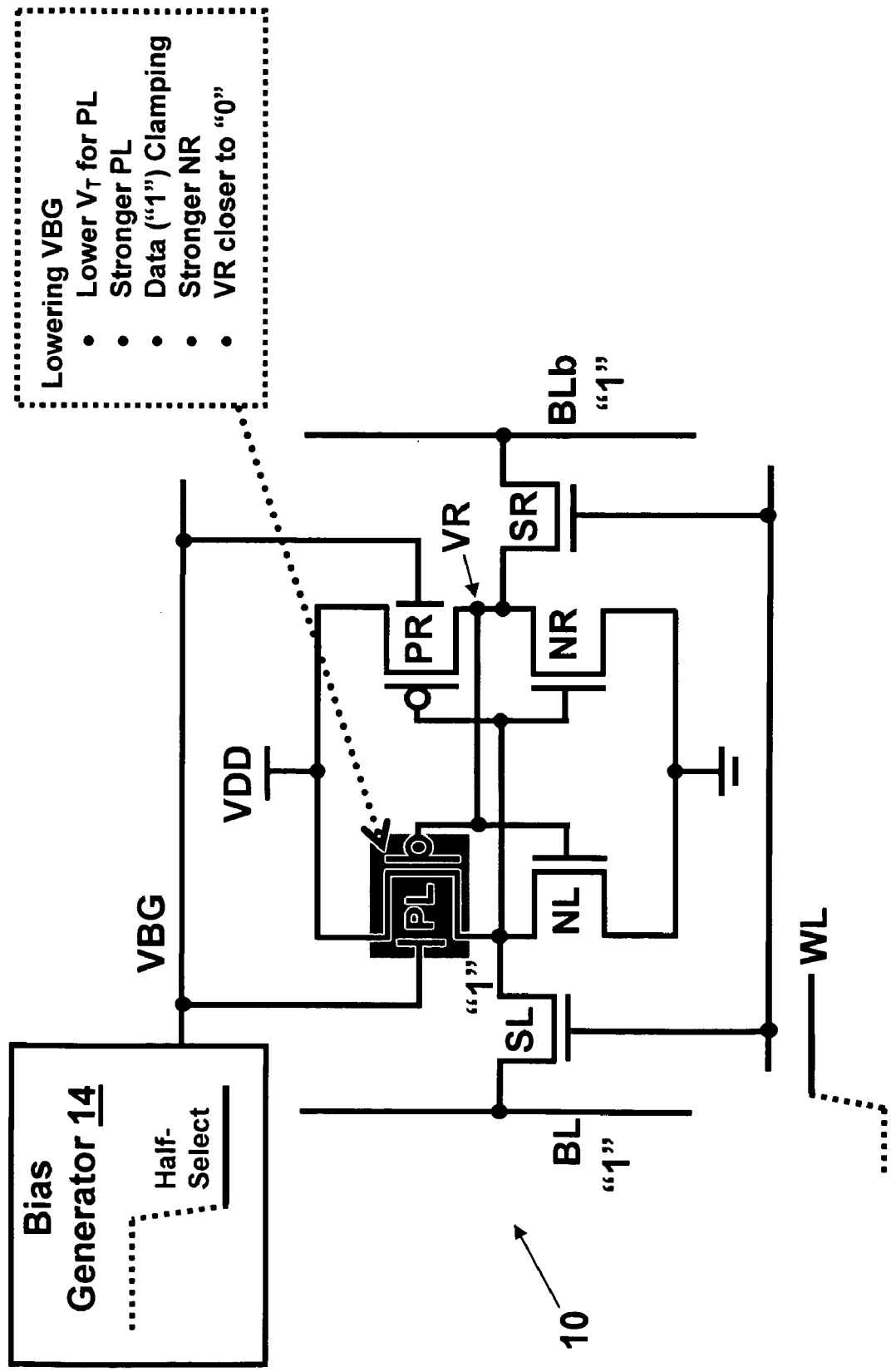
FIG. 4 depicts the SRAM cell of FIG. 1 during a Half-Select operational mode in accordance with an embodiment of the present invention.

The lowering of VBG during the Half-Select operational mode improves the data ("1") clamping ability of the SRAM cell 10. This process is depicted in FIG. 4. In particular, during the Half-Select operational mode of the SRAM cell 10, the bit lines BL and BLb are charged to "1" and the word line WL is asserted. In addition, the bias voltage VBG applied to the back gates of the pFETs PL and PR by the bias generator 14 is lowered to "0." As a result, the Vt of the pFET PL is lowered, increasing its strength and its ability to clamp a "1" at VL. In addition, the nFET NR is stronger, pulling the voltage at VR closer to "0." This prevents the voltage at VR from increasing to a value that is capable of turning the pFET PL off, preventing data clamping.

Figure 5:
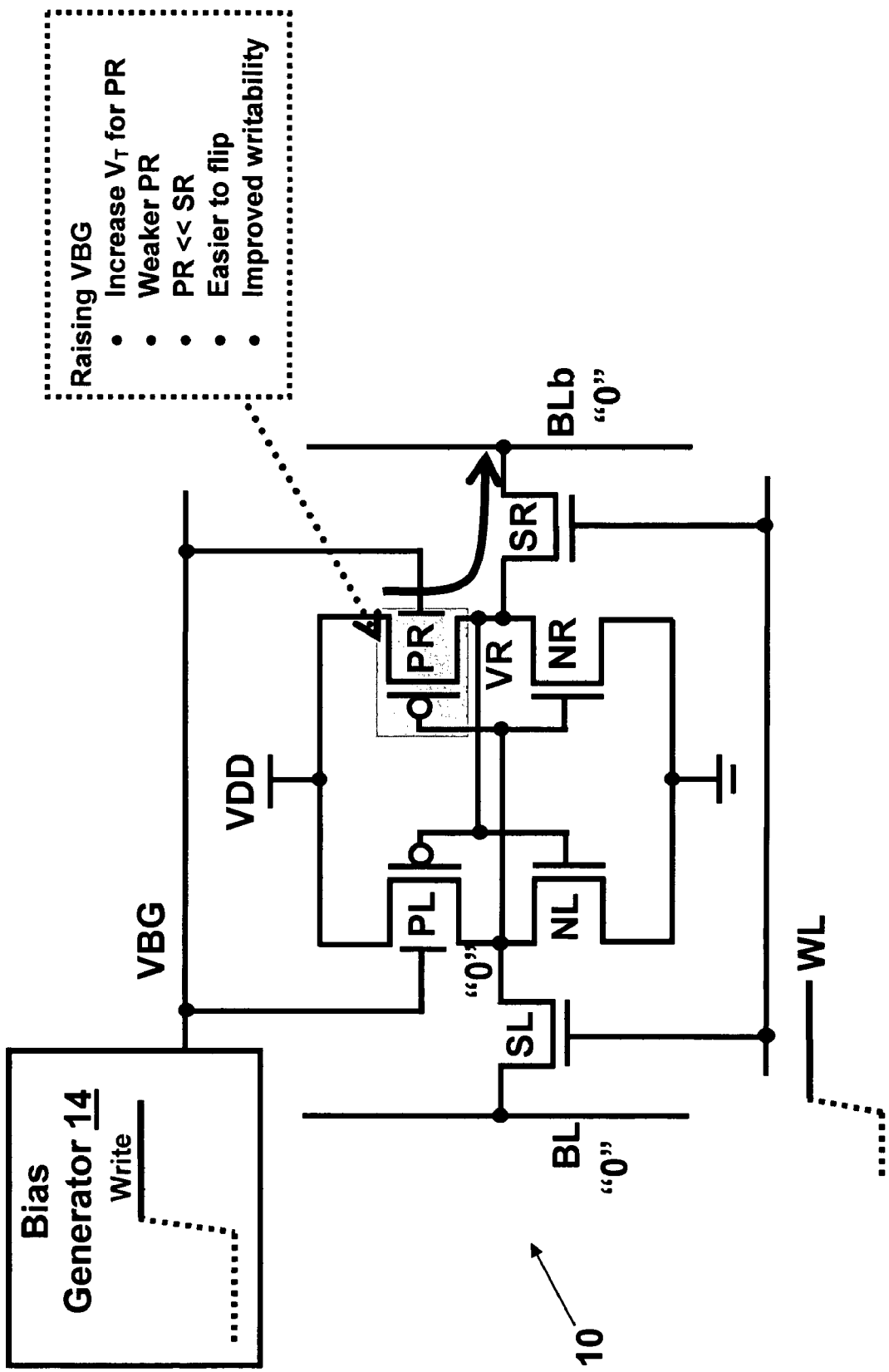
FIG. 5 depicts the SRAM cell of FIG. 1 during a Write operational mode in accordance with an embodiment of the present invention.

FIG. 5 depicts the SRAM cell of FIG. 1 during a Write operational mode in accordance with an embodiment of the present invention. In the Write operational mode, the bit lines BL and BLb are at "0," the word line WL is asserted, and the bias voltage VBG applied to the back gates of the pFETs PL and PR by the bias generator 14 is raised to "1." As a result, the Vt of the pFET PR increases, decreasing its strength, such that the strength of the pFET PR<<the strength of the nFET SR. This makes the SRAM cell 10 easier to flip, thereby improving its writability.

Figure 6:
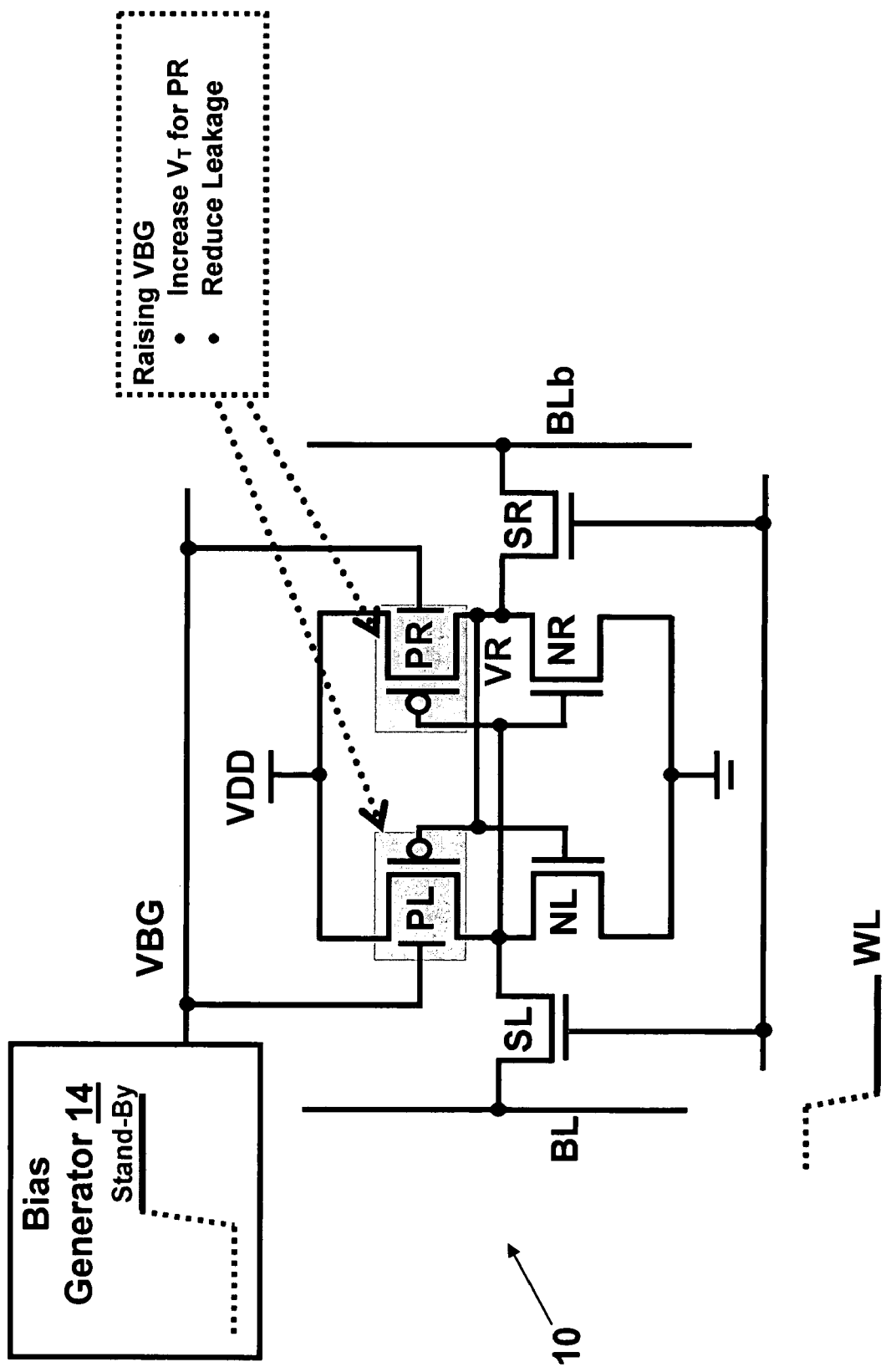
FIG. 6 depicts the SRAM cell of FIG. 1 during a Standby operational mode in accordance with an embodiment of the present invention.

FIG. 6 depicts the SRAM cell of FIG. 1 during a Stand-By operational mode in accordance with an embodiment of the present invention. In the Stand-By operational mode, the word line WL is at "0," and the bias voltage VBG applied to the back gates of the pFETs PL and PR by the bias generator 14 is raised to "1" ($\geq$VDD). As a result, the Vt of the pFETs PL and PR increases, decreasing their strength and reducing leakage current.

Figure 9:
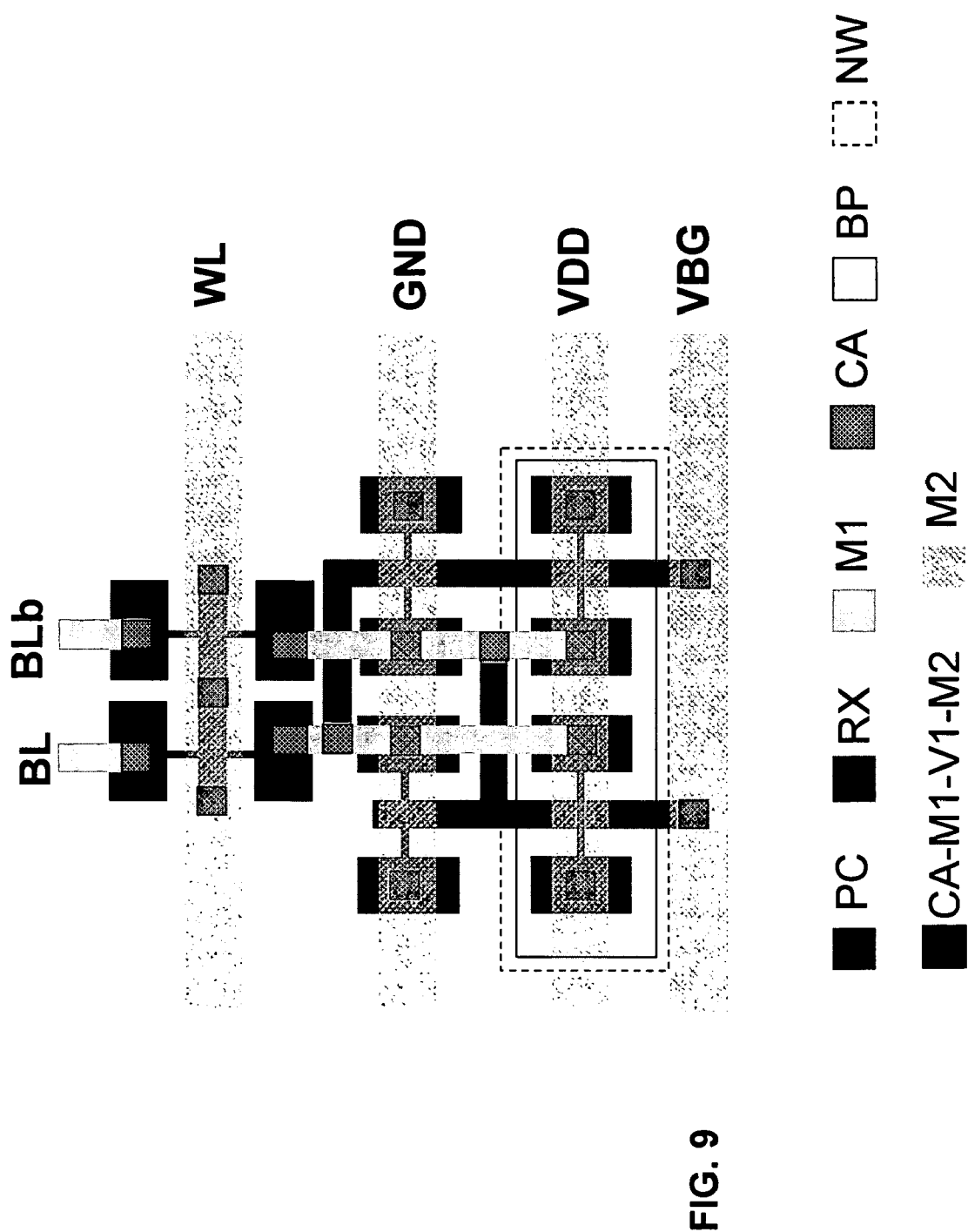
FIG. 9 depicts an illustrative physical design of the 6-T FinFET SRAM cell of FIG. 1.

An illustrative physical design of the 6-T FinFET SRAM cell 10 of FIG. 1 is depicted in FIG. 9.

Figure 7:
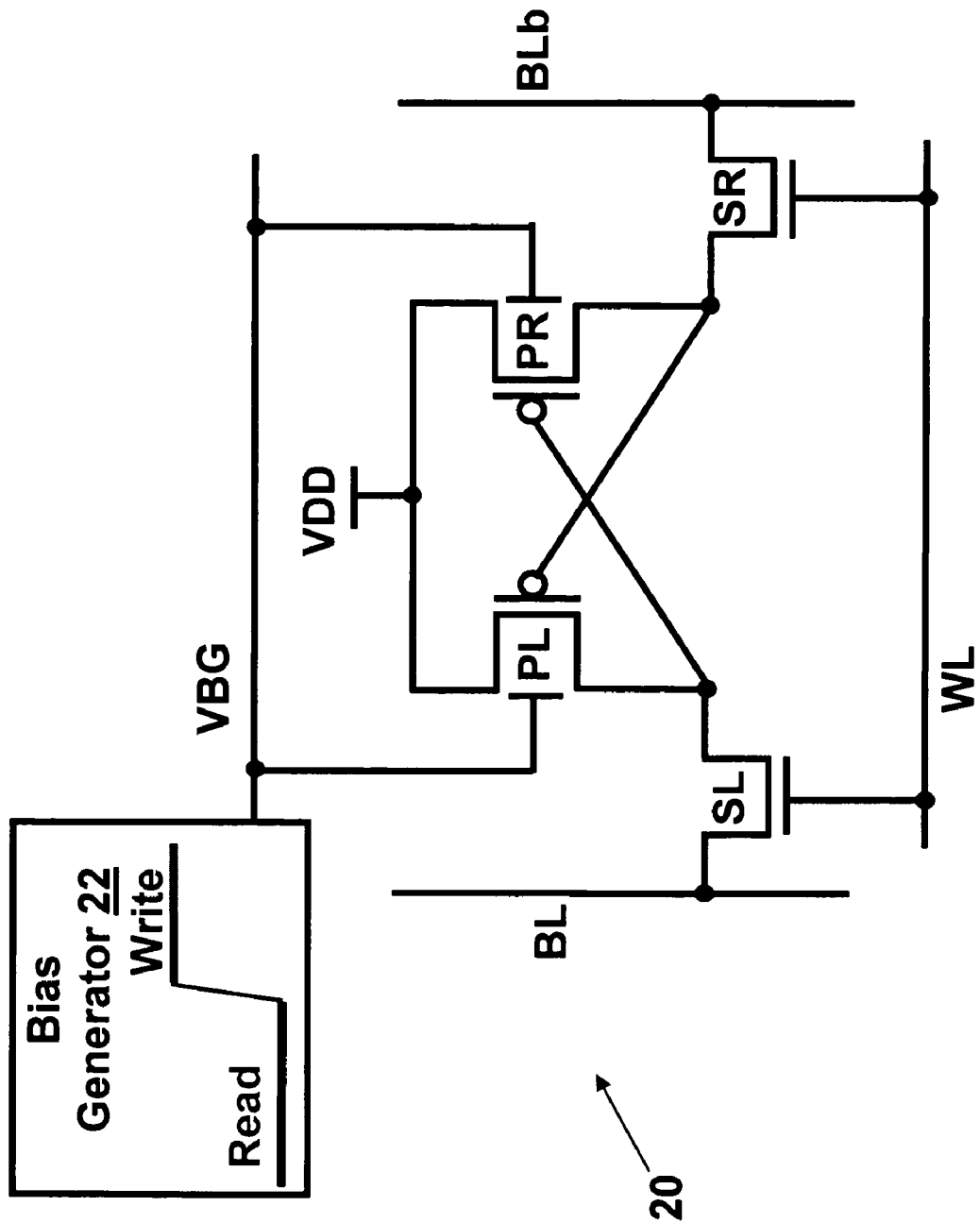
FIG. 7 depicts a four transistor (4-T) FinFET SRAM cell including dynamic control of back gate bias in accordance with an embodiment of the present invention.

FIG. 7 depicts a four transistor (4-T) FinFET SRAM cell 20 including dynamic control of back gate bias in accordance with an embodiment of the present invention. The SRAM cell 20 includes a pair of cross-coupled pull-up pFETs PL and PR and a pair of pass nFETs SL and SR connected to bit lines BL and BLb, respectively. A gate of each pass nFET SL and SR is connected to a word line WL. The SRAM cell 20 further includes a bias generator 22 for dynamically controlling the bias voltage VBG applied to the back gates of the pFETs PL and PR, based on the operational mode of the SRAM cell 20 (i.e., Read, Write), to improve the read and write stability of the SRAM cell 20. Similar to the 6T SRAM cell 10 described above, the bias generator 22 is configured to provide a bias voltage VBG of "0" to the back gates of the pFETs PL and PR during the read operational mode of the SRAM cell 20, and to provide a bias voltage VBG of "1" to the back gates of the pFETs PL and PR during the write operational mode of the SRAM cell 20.

Figure 10:
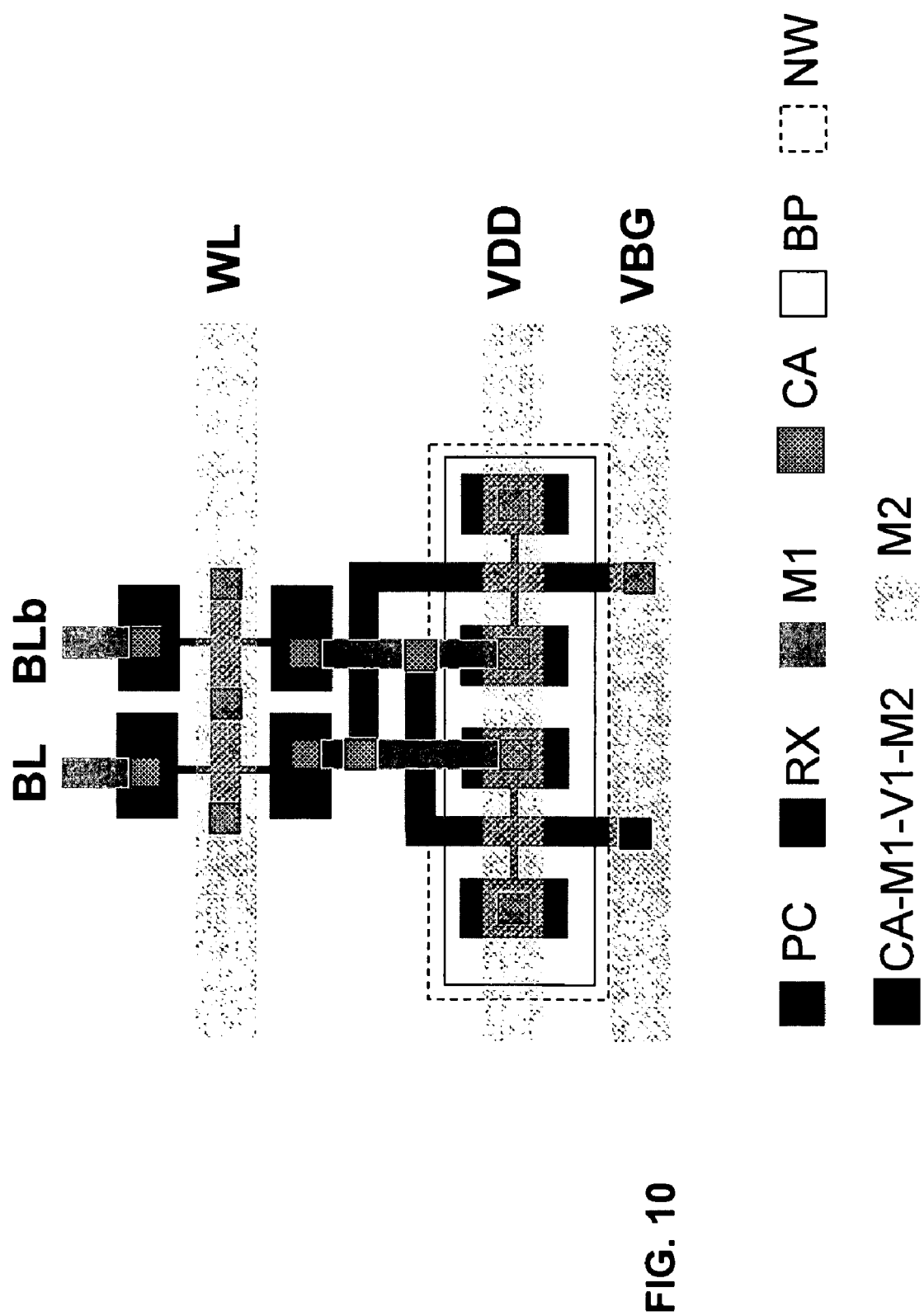
FIG. 10 depicts an illustrative physical design of the 4-T FinFET SRAM cell of FIG. 7.

An illustrative physical design of the 4-T 20 of FIG. 7 is depicted in FIG. 10.

Figure 8:
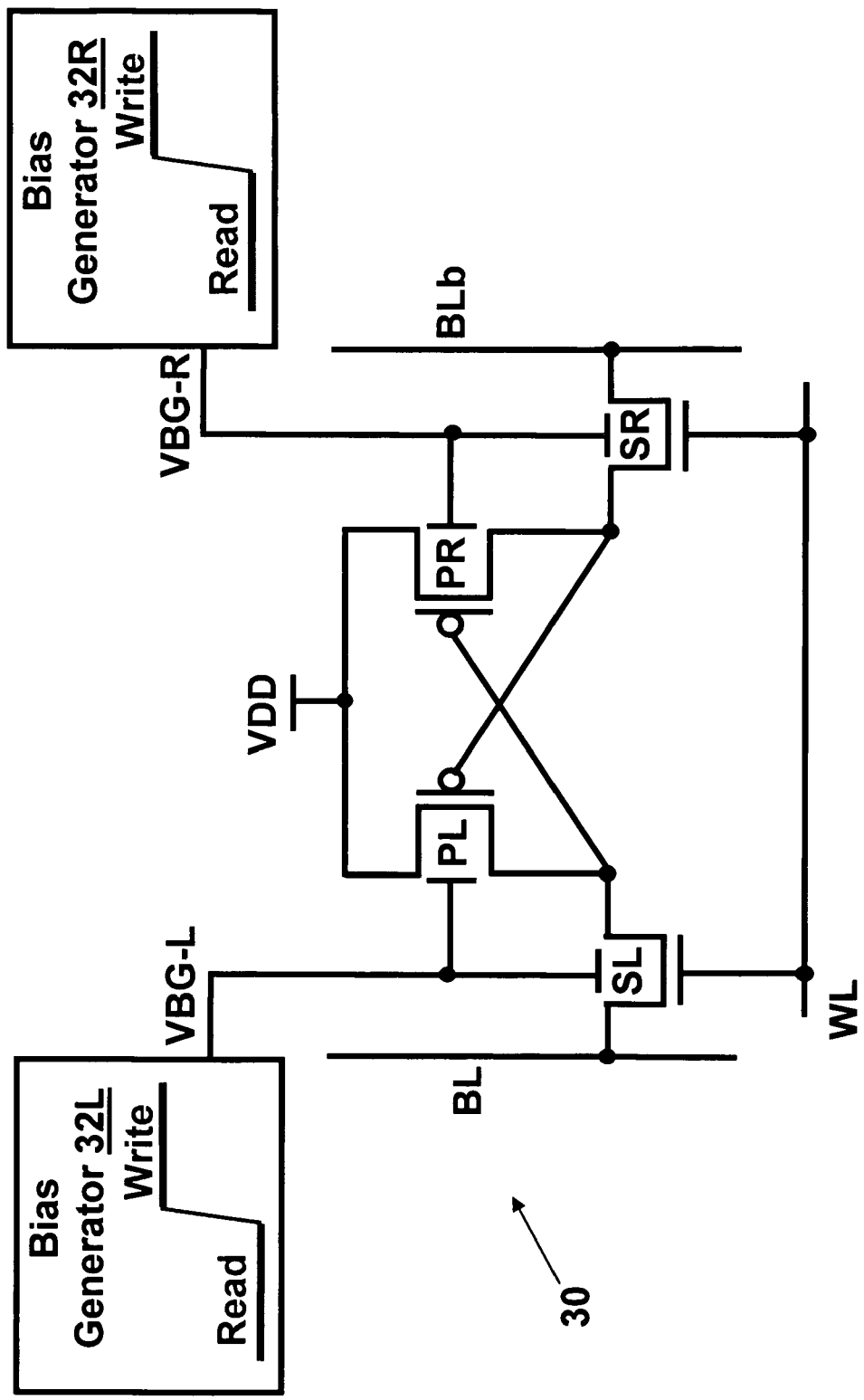
FIG. 8 depicts a 4-T FinFET SRAM cell including dynamic control of back gate bias in accordance with another embodiment of the present invention.

FIG. 8 depicts a four transistor (4-T) FinFET SRAM cell 30 including dynamic control of back gate bias in accordance with another embodiment of the present invention. The SRAM cell 30 includes a pair of cross-coupled pull-up pFETs PL and PR and a pair of pass nFETs SL and SR connected to bit lines BL and BLb, respectively. A gate of each pass nFET SL and SR is connected to a word line WL. The SRAM cell 30 further includes a first bias generator 32L for dynamically controlling a bias voltage VBG-L applied to the back gates of the pFET PL and the pass nFET SL, and a second bias generator 32R for dynamically controlling a bias voltage VBG-R applied to the back gates of the pFET PR and the pass nFET SR, based on the operational mode of the SRAM cell 30 (i.e., Read, Write), to improve the read and write stability of the SRAM cell 30.

The bias generator 32L is configured to provide a bias voltage VBG-L of "0" to the back gates of the pFET PL and the pass nFET SL during the read operational mode of the SRAM cell 30, and to provide a bias voltage VBG-L of "1" to the back gates of the pFET PL and the pass nFET SL during the write operational mode of the SRAM cell 30. The bias generator 32R is configured to provide a bias voltage VBG-R of "0" to the back gates of the pFET PR and the pass nFET SR during the read operational mode of the SRAM cell 30, and to provide a bias voltage VBG-R of "1" to the back gates of the pFET PR and the pass nFET SR during the write operational mode of the SRAM cell 30. The bias voltages VBG-L and VBG-R can be independently and/or systematically controlled to optimize the SRAM cell 30.

Figure 11:
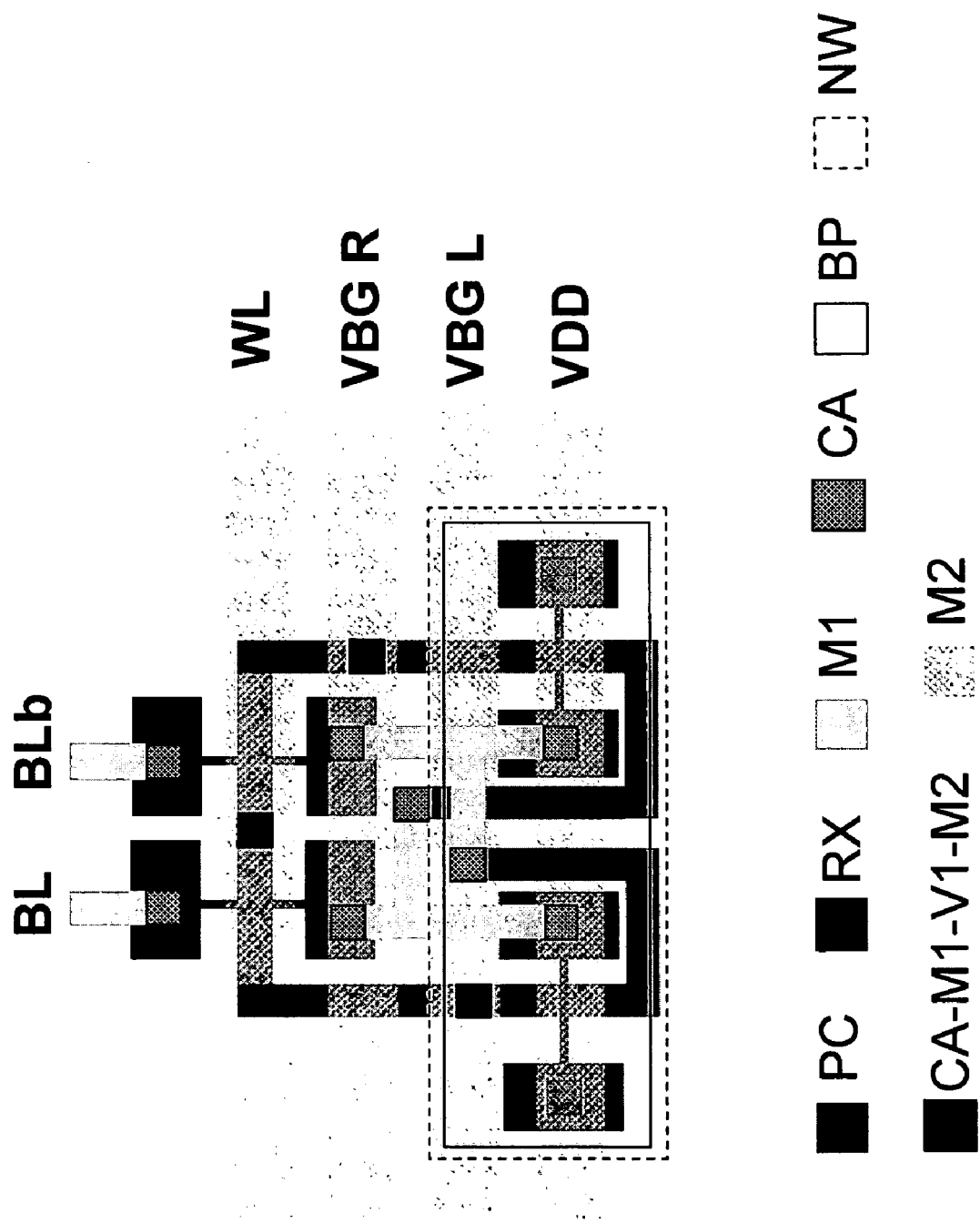
FIG. 11 depicts an illustrative physical design of the 4-T FinFET SRAM cell of FIG. 8.

An illustrative physical design of the 4-T FinFET SRAM cell 30 of FIG. 8 is depicted in FIG. 11.

The foregoing description of the invention has been presented for purposes of illustration and description. It is not intended to be exhaustive or to limit the invention to the precise form disclosed, and obviously, many modifications and variations are possible. For example, the dynamic control of back gate bias provided by the present invention may be applied to other types of double gate transistor SRAM cells. In addition, the dynamic control of back gate bias provided by the present invention may used in conjunction with other types/configurations of SRAM cells (e.g., eight transistor 8T SRAM cell, ten transistor 10T SRAM cell, etc.).

The invention claimed is:

1. A method for controlling back gate bias in a static random access memory (SRAM) cell, comprising:
   providing a back gate bias voltage to a back gate of at least one transistor in the SRAM cell; and
   dynamically controlling the back gate bias voltage based on an operational mode of the SRAM cell by:
      applying a first back gate bias voltage during a Read operational mode and a Half-Select operational mode of the SRAM cell, wherein in the Read mode, bit lines are precharged to a high level and a write line is at a high level, and wherein in the Half-Select mode the bit lines are charged to a high level and the write line is at a high level; and
      applying a second back gate bias voltage, different from the first back gate bias voltage, during a Write operational mode and a Standby mode of the SRAM cell, wherein in the Write mode, the bit lines are at a low level and the write line is at a high level, and wherein in the Standby mode, the write line is at a low level.

2. The method of claim 1, the at least one transistor comprising a FinFET having independently controlled front and back gates.

3. The method of claim 1, the providing a back gate bias voltage further comprising:
providing the back gate bias voltage to a back gate of a plurality of pull-up pFETs in the SRAM cell.

4. A system for controlling back gate bias in a static random access memory (SRAM) cell, comprising:
a back gate bias voltage generator coupled to a back gate of at least one transistor in the SRAM cell for dynamically controlling the back gate bias voltage applied to the at least one transistor based on an operational mode of the SRAM cell;
the bias voltage generator:
applying a first back gate bias voltage during a Read operational mode and a Half-Select operational mode of the SRAM cell, wherein in the Read mode, bit lines are precharged to a high level and a write line is at a high level, and wherein in the Half-Select mode the bit lines are charged to a high level and the write line is at a high level; and
applying a second back gate bias voltage, different from the first back gate bias voltage, during a Write operational mode and a Standby mode of the SRAM cell, wherein in the Write mode, the bit lines are at a low level and the write line is at a high level, and wherein in the Standby mode, the write line is at a low level.

5. The system of claim 4, the at least one transistor comprising a FinFET having independently controlled front and back gates.

6. The system of claim 4, the at least one transistor comprising a pull-up pFET.

7. The system of claim 4, the SRAM cell being selected from the group consisting of a four transistor (4T) SRAM cell and a six transistor (6T) SRAM cell.

8. An integrated circuit comprising:
a static random access memory (SRAM) cell; and
a system for controlling back gate bias in the SRAM cell, the system for controlling including a back gate bias voltage generator coupled to a back gate of at least one transistor in the SRAM cell for dynamically controlling the back gate bias voltage applied to the at least one transistor based on an operational mode of the SRAM cell;
the bias voltage generator:
applying a first back gate bias voltage during a Read operational mode and a Half-Select operational mode of the SRAM cell, wherein in the Read mode, bit lines are precharged to a high level and a write line is at a high level, and wherein in the Half-Select mode the bit lines are charged to a high level and the write line is at a high level; and
applying a second back gate bias voltage, different from the first back gate bias voltage, during a Write operational mode and a Standby mode of the SRAM cell, wherein in the Write mode, the bit lines are at a low level and the write line is at a high level, and wherein in the Standby mode, the write line is at a low level.

9. The integrated circuit of claim 8, the at least one transistor comprising a FinFET having independently controlled front and back gates.

10. The integrated circuit of claim 8, the at least one transistor comprising a pull-up pFET.

11. The integrated circuit of claim 8, the SRAM cell being selected from the group consisting of a four transistor (4T) SRAM cell and a six transistor (6T) SRAM cell.

12. A static random access memory (SRAM) cell, comprising:
at least one transistor having a back gate; and
a back gate bias voltage generator coupled to the back gate of the at least one transistor for dynamically controlling the back gate bias voltage applied to the at least one transistor based on an operational mode of the SRAM cell;
the bias voltage generator:
applying a first back gate bias voltage during a Read operational mode and a Half-Select operational mode of the SRAM cell, wherein in the Read mode, bit lines are precharged to a high level and a write line is at a high level, and wherein in the Half-Select mode the bit lines are charged to a high level and the write line is at a high level; and
applying a second back gate bias voltage, different from the first back gate bias voltage, during a Write operational mode and a Standby mode of the SRAM cell, wherein in the Write mode, the bit lines are at a low level and the write line is at a high level, and wherein in the Standby mode, the write line is at a low level.

13. The SRAM cell of claim 12, the SRAM cell being selected from the group consisting of a four transistor (4T) SRAM cell and a six transistor (6T) SRAM cell.

* * * * *